(12) United States Patent
Liu

(10) Patent No.: US 7,691,754 B2
(45) Date of Patent: Apr. 6, 2010

(54) METHOD FOR REMOVING PHOTORESIST LAYER AND METHOD OF FORMING OPENING

(75) Inventor: An-Chi Liu, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 147 days.

(21) Appl. No.: 11/550,419

(22) Filed: Oct. 18, 2006

(65) Prior Publication Data
US 2008/0096387 A1    Apr. 24, 2008

(51) Int. Cl.
*H01L 21/302* (2006.01)

(52) U.S. Cl. .................. 438/740; 438/706; 438/721; 438/725

(58) Field of Classification Search .......... 438/700, 438/714, 721, 725, 740, 706, 710, 712, 720; 134/1.2
See application file for complete search history.

(56) References Cited

U.S. PATENT DOCUMENTS

| 6,838,381 | B2 |   | 1/2005 | Hsu et al. | |
| 6,884,736 | B2 |   | 4/2005 | Wu et al. | |
| 6,951,823 | B2 | * | 10/2005 | Waldfried et al. | 438/710 |
| 7,338,897 | B2 | * | 3/2008 | Inukai et al. | 438/640 |
| 2004/0067635 | A1 |   | 4/2004 | Wu et al. | |
| 2005/0112883 | A1 | * | 5/2005 | Savas et al. | 438/689 |
| 2005/0136644 | A1 | * | 6/2005 | Inukai et al. | 438/623 |
| 2005/0196967 | A1 | * | 9/2005 | Savas et al. | 438/700 |
| 2005/0282395 | A1 | * | 12/2005 | Chang et al. | 438/740 |
| 2007/0045227 | A1 | * | 3/2007 | Wu et al. | 216/41 |

FOREIGN PATENT DOCUMENTS

CN    1433062    7/2003

OTHER PUBLICATIONS

"1st Office Action of counterpart China application", issued on May 8, 2009, p. 1-p. 6.
"Office Action of Taiwan counterpart application", issued on Jul. 27, 2009, p. 1-p. 6.
"Office Action of Taiwan counterpart application", issued on Nov. 20, 2009, p. 1-p. 5.

* cited by examiner

*Primary Examiner*—Lan Vinh
(74) *Attorney, Agent, or Firm*—Jianq Chyun IP Office

(57) ABSTRACT

A method for removing a photoresist layer is provided. The method is suitable for a dielectric layer, wherein the dielectric layer has a patterned photoresist layer formed thereon and a metal silicide layer disposed thereunder and there is an etching stop layer disposed between the dielectric layer and the metal silicide layer. The method comprises steps of removing a portion of the dielectric layer by using the patterned photoresist layer as a mask so as to form an opening, wherein the opening exposes a portion of the etching stop layer above the metal silicide layer. the patterned photoresist layer is removed by using an oxygen-free plasma.

12 Claims, 3 Drawing Sheets

METHOD FOR REMOVING PHOTORESIST LAYER AND METHOD OF FORMING OPENING

BACKGROUND OF THE INVENTION

1. Field of Invention

The present invention relates to a semiconductor process. More particularly, the present invention relates to a method for removing a photoresist layer.

2. Description of Related Art

In the manufacturing process of the semiconductor, there are many etching processes using photoresist layer to define patterns. However, after the etching process, the photoresist layer must be removed to perform the subsequent processes.

The conventional photolithography process comprises steps of coating a photoresist layer over a wafer going to be etched and then performing an exposure process on the photoresist layer by using a mask with a specific pattern so as to transfer the pattern on the mask onto the photoresist layer. Hence, the property of the exposed portion of the photoresist layer is changed. Thereafter, the portion of the photoresist layer which is going to be etched is removed and the remaining portion of the photoresist layer is served as a mask in the etching process performing on the wafer. After the etching process is performed on the wafer, the remaining portion of the photoresist layer is removed. The currently etching process includes anisotropic etching using high density plasma and, at the same high density plasma tool, the photoresist layer is in-situ removed by being bombarded by the oxygen plasma. However, in the high density plasma process for removing the photoresist layer, the oxygen atoms with high energy in the plasma would penetrating through the etching stop layer under the dielectric layer and the metal silicide layer under the etching stop layer is oxidized by the penetrating oxygen atoms. Therefore, the electrical performance of the metal silicide layer is changed and the performance of the device is affected as well.

SUMMARY OF THE INVENTION

Accordingly, the present invention provides a method for removing a photoresist layer capable of preventing the underlayer conductive layer from being damaged in the process for removing the photoresist layer.

The present invention further provides a method for forming an opening capable of maintaining the electrical performance of the conductive layer under the dielectric layer.

To achieve these and other advantages and in accordance with the purpose of the invention, as embodied and broadly described herein, the invention provides a method for removing a photoresist layer suitable for a dielectric layer, wherein the dielectric layer has a patterned photoresist layer formed thereon and a metal silicide layer disposed thereunder and there is an etching stop layer disposed between the dielectric layer and the metal silicide layer. The method comprises steps of removing a portion of the dielectric layer by using the patterned photoresist layer as a mask so as to form an opening, wherein the opening exposes a portion of the etching stop layer above the metal silicide layer. The patterned photoresist layer is removed by using an oxygen-free plasma.

The present invention further provides a method for forming an opening. The method comprises steps of providing a substrate having a dielectric layer formed thereon, wherein there is a conductive layer disposed under the dielectric layer. A patterned photoresist layer is formed on the dielectric layer and then an anisotropic etching process is performed by using the patterned photoresist layer as a mask so as to form a predetermined opening in the dielectric layer, wherein the predetermined opening is located right above the conductive layer and the bottom of the predetermined opening exposes a portion of the dielectric layer. The patterned phototresist layer is removed by using a hydrogen-containing plasma. The predetermined opening is opened to be an opening, wherein the bottom of the opening exposes a portion of the conductive layer.

In the present invention, during the etching of the dielectric layer, the structure of the etching stop layer is damaged. Ultimately, the barrier capability of the etch stop layer is compromised. Accordingly, since the oxygen-free plasma/hydrogen-containing plasma is used in the photoresist removing process after the opening is formed and when the patterned photoresist layer is removed, the conductive layer under the bottom of the opening is prevented from being damaged by the oxygen plasma and the electrical property of the conductive layer is not affected. Therefore, the electrical performance of the conductive layer can be maintained.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
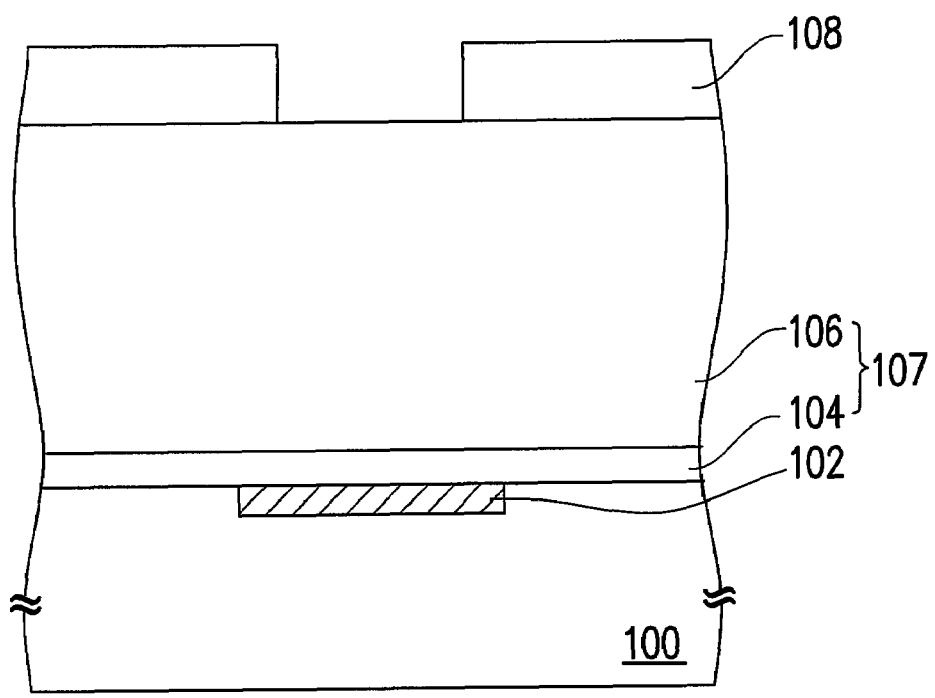
FIGS. 1A through 1D are cross-sectional views schematically illustrating a method for forming an opening according to one embodiment of the invention.

FIGS. 1A through 1D are cross-sectional views schematically illustrating a method for forming an opening according to one embodiment of the invention. As shown in FIG. 1A, a substrate 100 having a conductive layer 102 formed therein is provided. The material of the conductive layer 102 can be, for example, polysilicon or metal silicide. Furthermore, the metal silicide includes nickel silicide, titanium silicide and cobalt silicide. Also, the conductive layer 102 can be, for example, made of titanium nitride. Moreover, there is a dielectric structure 107 disposed over the substrate 100. The dielectric structure 107 comprises a dielectric layer 106 and an etching stop layer 104 disposed between the dielectric layer 106 and the substrate 100. The dielectric layer can be, for example, made of silicon oxide. The etching stop layer 104 can be, for example, made of silicon nitride, silicon carbon nitride, silicon oxynitride or silicon carbon oxide. Thereafter, a patterned photoresist layer 108 is formed on the dielectric layer 106. The patterned photoresist layer 108 exposes a portion of the surface of the dielectric layer 106.

Figure 1B:
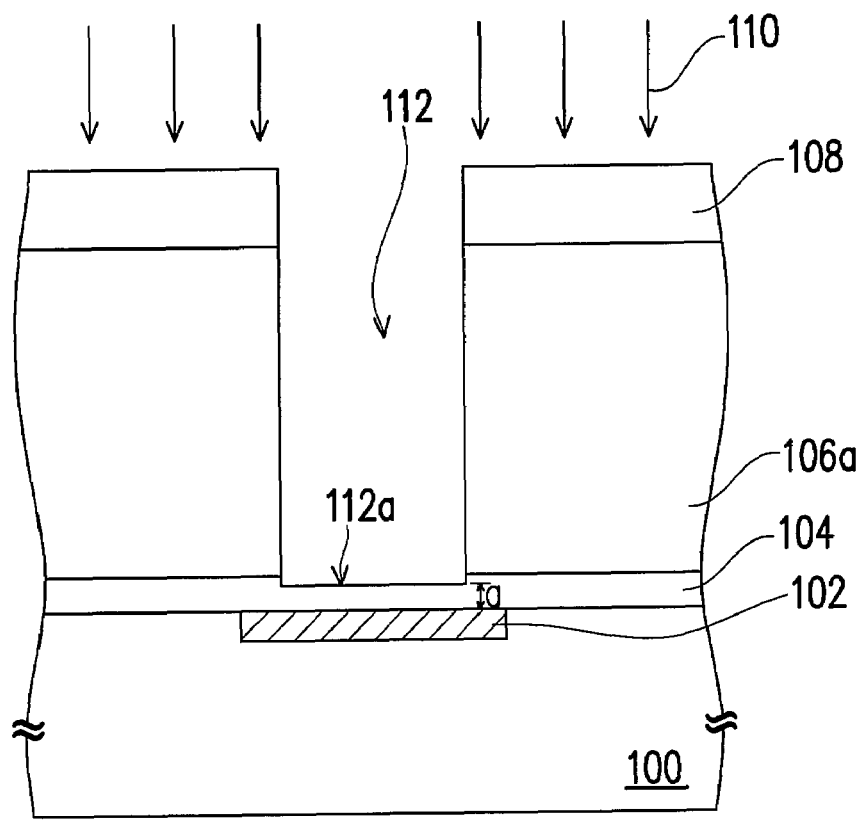

As shown in FIG. 1B, by using the patterned photoresist layer 108 as a mask, an anisotropic etching process 110 is performed to remove a portion of the dielectric structure 107 so as to form a predetermined opening 112 in the dielectric structure 107. The bottom 112a of the predetermined opening 112 exposes a portion of the dielectric structure 107. That is, a portion of the dielectric layer 106 exposed by the patterned photoresist layer 108 is removed until a portion of the etching stop layer 104 is exposed by the bottom 112a of the predetermined opening 112. Meanwhile, the dielectric layer 106 is transformed into a dielectric layer 106a. Alternatively, a portion of the etching stop layer 104 is removed as the exposed portion of the dielectric layer 106 is removed and the predetermined opening 112 is located within the etching stop layer 104. It should be noticed that the predetermined opening 112 is located right above the conductive layer 102. In addition, the distance a between the bottom 112a of the predetermined opening 112 and the surface of the conductive layer is about 50~100 angstroms. On the other words, the thickness of the etching stop layer between the bottom 112a of the predetermined opening 112 and the surface of the conductive layer is about 50~100 angstroms.

Figure 1C:
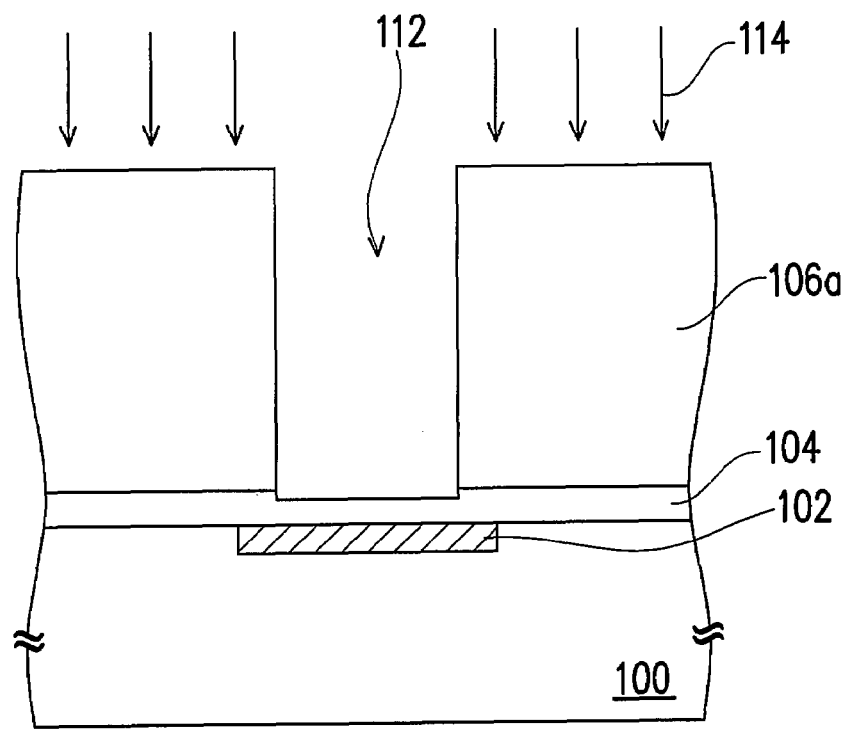

As shown in FIG. 1C, a photoresist removing process 114 is performed to remove the patterned photoresist layer 108. In the photoresist removing process 114, an oxygen-free plasma is used to remove the patterned photoresist layer 108. The oxygen-free plasma can be, for example, a hydrogen-containing plasma and the volume percentage of the hydrogen gas is about 4%~10%. Furthermore, the carrier gas of the oxygen-free plasma can be, for example, nitrogen or inert gas such as helium, neon and argon. Also, the photoresist removing process can be, for example, performed at a temperature of about 200~300° C. and at a pressure of about 500~1500 mTorr for about 120 seconds.

Figure 1D:
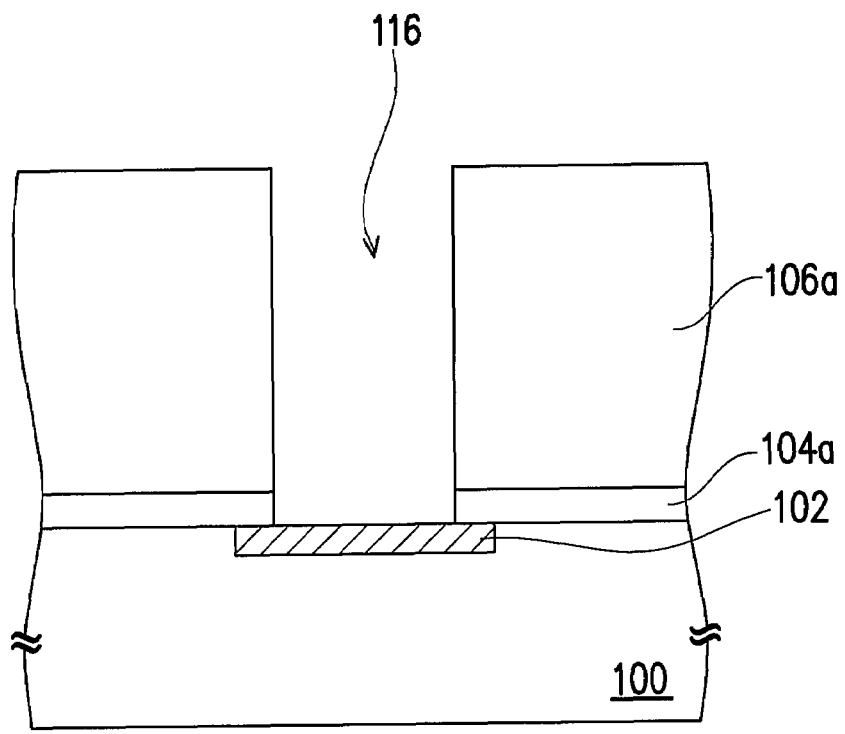

As shown in FIG. 1D, after the patterned photoresist layer 108 is removed, the predetermined opening 112 (as shown in FIG. 1C) is opened to form an opening 116 in the dielectric layer 106a and the etching stop layer 104a. The bottom of the opening 116 expose a portion of the surface of the conductive layer 102.

Figure 2:
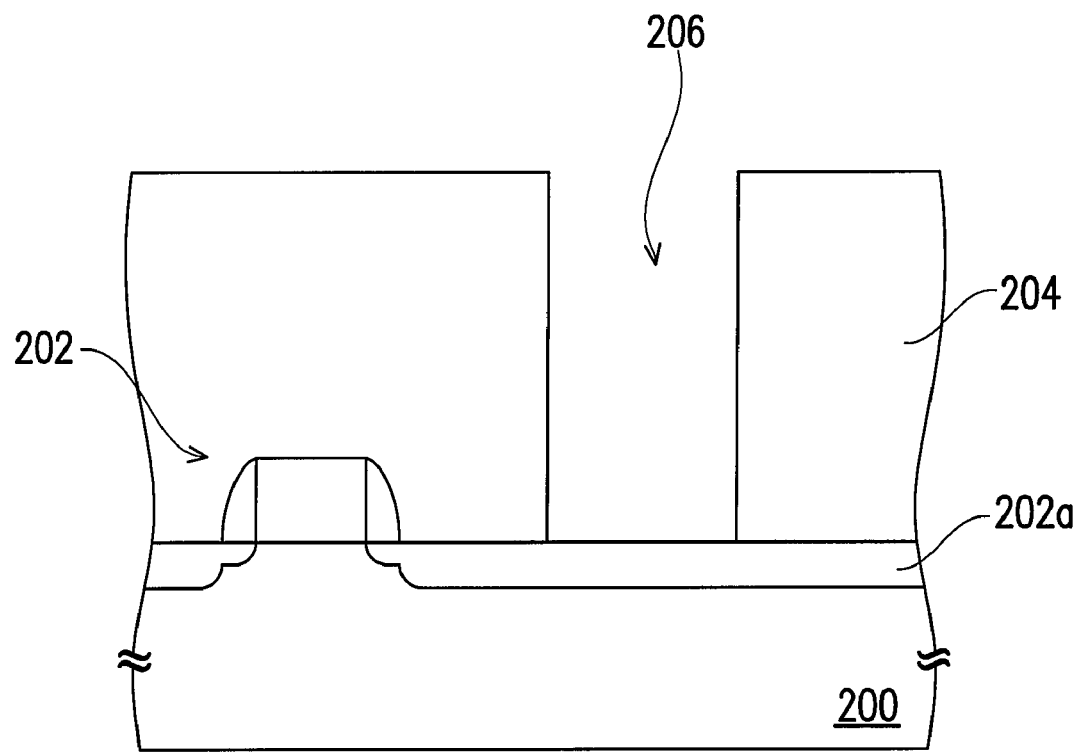
FIG. 2 is a schematic cross-sectional view of a contact opening according to another embodiment of the present invention.

The opening formed by using aforementioned method can be a via hole in the dielectric layer, a node opening for a capacitor or a contact opening (as shown in FIG. 2). That is, the aforementioned method for forming the opening can be applied to form the node opening in the manufacturing process of a capacitor, to form a via hole in the manufacturing process of the resistor or the interconnects or to form a contact opening 206 (as shown in FIG. 2) in a manufacturing process of the metal oxide semiconductor.

Figure 3:
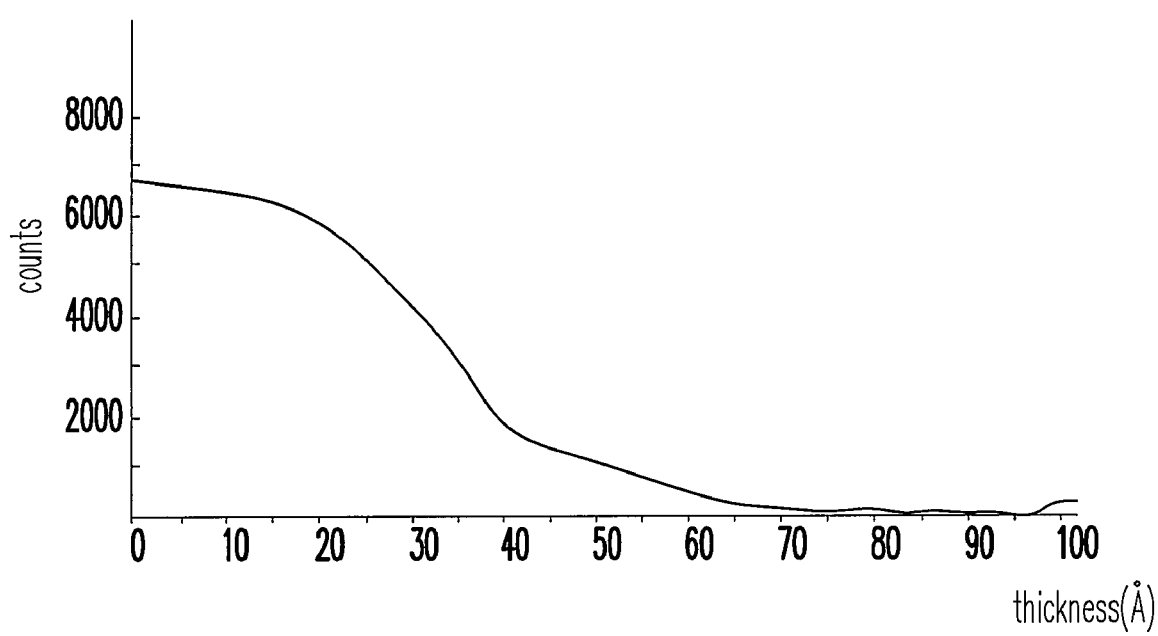
FIG. 3 is a counts-thickness of the etching stop layer plot diagram.

FIG. 3 is a counts-thickness of the etching stop layer plot diagram. As shown in FIG. 3, during the photoresist removing process with the use of the oxygen plasma, when the thickness of the dielectric structure or the etching stop layer covering the conductive layer is larger than 70 angstroms, the oxygen atoms do not penetrating through the dielectric structure or the etching stop layer and reach the conductive layer. However, as the size of the device is decreased, the thickness of the dielectric structure or the etching stop layer is decreased. When the thickness of the dielectric structure or the etching stop layer covering the conductive layer is smaller than 70 angstroms, the oxygen atoms in the oxygen plasma penetrate through the dielectric structure or the etching stop layer and oxide the conductive layer. Therefore, the electrical property of the conductive layer is changed and the electrical performance of the device is degraded.

In the present invention, because the oxygen-free plasma, the hydrogen-containing plasma, is used during the patterned photoresist layer 108 is removed, the underlayer conductive layer can be prevented from being damaged by the penetrating oxygen atoms even the thickness of the dielectric structure or the etching stop layer covering the conductive layer is decreased. Therefore, the electrical property of the conductive layer is maintained and the performance of the device is maintained as well.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method for removing a photoresist layer suitable for a dielectric layer, wherein the dielectric layer has a patterned photoresist layer formed thereon and a metal silicide layer disposed thereunder and there is an etching stop layer disposed between the dielectric layer and the metal silicide layer, the method comprising:

removing a portion of the dielectric layer by using the patterned photoresist layer as a mask so as to form an opening, wherein the opening exposes a portion of the etching stop layer above the metal silicide layer, and the thickness of the exposed portion of the etching stop layer is about 50~100 angstroms; and removing the patterned photoresist layer with a use of an oxygen-free plasma, wherein during removing the patterned photoresist layer, the metal silicide layer under a bottom of the opening is not exposed by the opening and is still covered with the etching stop layer.

2. The method of claim 1, wherein the volume percentage of a hydrogen gas in the oxygen-free plasma is about 4%~10%.

3. The method of claim 1, wherein a carrier gas of the oxygen-free plasma includes nitrogen.

4. The method of claim 1, wherein a carrier gas of the oxygen-free plasma includes an inert gas.

5. The method of claim 1, wherein the material of the etching stop layer is selected from the group consisting of silicon nitride, silicon carbon nitride, silicon oxynitride and silicon carbon oxide.

6. The method of claim 1, wherein the material of the metal silicide layer is selected from the group consisting of nickel silicide, titanium silicide and cobalt silicide.

7. A method for forming an opening, the method comprising:

providing a substrate having a dielectric layer formed thereon, wherein there is a conductive layer disposed under the dielectric layer;

forming a patterned photoresist layer on the dielectric layer;

performing an anisotropic etching process by using the patterned photoresist layer as a mask so as to form a first opening in the dielectric layer, wherein the first opening is located right above the conductive layer and the bottom of the first opening exposes a portion of the dielectric layer, and the distance between the bottom of the first opening and the top surface of the conductive layer is about 50~100 angstroms;

removing the patterned phototresist layer with a use of a hydrogen-containing plasma, wherein during removing the patterned photoresist layer, the conductive layer under a bottom of the first opening is not exposed by the first opening and is still covered with the dielectric layer; and opening the first opening to be an opening, wherein the bottom of the opening exposes a portion of the conductive layer.

8. The method of claim 7, wherein the volume percentage of the hydrogen gas in the hydrogen-containing plasma is about 4%~10%.

9. The method of claim 7, wherein a carrier gas of the hydrogen-containing plasma includes nitrogen.

10. The method of claim 7, wherein a carrier gas of the hydrogen-containing plasma includes an inert gas.

11. The method of claim 7, wherein the material of the conductive layer is selected from the group consisting of nickel silicide, titanium silicide, cobalt silicide, polysilicon and titanium nitride.

12. The method of claim 7, wherein the opening includes a contact opening, a via hole and a node opening.

* * * * *